United States Patent [19]

Martinez et al.

[11] Patent Number: 4,709,377
[45] Date of Patent: Nov. 24, 1987

[54] VITERBI DECODER FOR WIRELINE MODEMS

[75] Inventors: Kenneth Martinez, Pinellas Park; Gregory Mack, St. Petersburgh, both of Fla.

[73] Assignee: Paradyne, Largo, Fla.

[21] Appl. No.: 710,978

[22] Filed: Mar. 13, 1985

[51] Int. Cl.[4] .......................... H04L 5/12; H04L 27/06
[52] U.S. Cl. ......................................... 375/75; 375/39; 375/99; 375/118; 371/43
[58] Field of Search ....................... 375/39, 42, 57, 58, 375/75, 94, 99, 114, 118; 371/43, 46

[56] References Cited

U.S. PATENT DOCUMENTS 4,545,054 10/1985 Davis ................................... 371/43
4,583,078 4/1986 Shenoy et al. ............. 340/347 DD Primary Examiner—Robert L. Griffin
Assistant Examiner—Marianne Huseman
Attorney, Agent, or Firm—Kane, Dalsimer, Sullivan, Kurucz, Levy, Eisele and Richard

[57] ABSTRACT

A Viterbi decoder is disclosed particularly suited for implementation in a microprocessor-based modem. The decoder calculates the branch metric corresponding to each point of a signal constellation by calculating the Euclidean distance between a received point and a subset of constellation points. Prior to the metric calculations, each received point is translated to the first quadrant and, if necessary, truncated.

3 Claims, 3 Drawing Figures

VITERBI DECODER FOR WIRELINE MODEMS

BACKGROUND OF THE INVENTION

1. Field of Invention

This invention pertains to the receiver section of a modem used in data communication, and more particularly, to a receiver incorporating a Viterbi decoder without the need for special processors dedicated for trellis decoding.

2. Background of the Invention

Digital data is frequently exchanged over communication channels using wireline modems. It is commercially advantageous to operate these modems at very high speeds and at lower signal-to-noise ratios. Therefore, various schemes have been devised for improving the performance of standard modems at lower signal-to-noise ratios. One such scheme, commonly known as trellis encoding, involves the use of redundant data bits used to generate a preselected allowable number of data sets. At the receiver, the redundant bits are used to correct errors in the received signals. It has been found that trellis encoding provides a gain of at least 4db in the signal-to-noise ratio of the data signals received by wireline modems. However, prior art trellis decoding or Viterbi decoding schemes involve a large number of calculations and memory which must be performed in external, relatively large capacity processors. Therefore, there is a need for a Viterbi decoder which uses a simpler decoding scheme, requiring a relatively smaller data processor. Such a decoder would be especially advantageous in a microprocessor-based modem in which the resident microprocessor could also be used for Viterbi decoding, thereby eliminating the need for an external processor.

SUMMARY OF THE INVENTION

In accordance with the present invention, in a Viterbi decoder for a receiver section of a modem a received QAM signal is represented as a point on a complex plane and a set of ideal signal constellation points is determined, set constellation points being the closet points to the received point. A branch metric is then calculated for each ideal point of the set based on the Euclidean distance to the received point. The branch metrics corresponding to each point of the signal constellation is updated and a final decoding is performed, based on the shortest branch metric path. Temporary memories are provided for storing the branch metrics, for path data pointers and for the trace back, all of which are parameters used to track the path metrics over a preselected number of received signals or bauds.

DETAILED DESCRIPTION OF THE INVENTION

Figure 1:
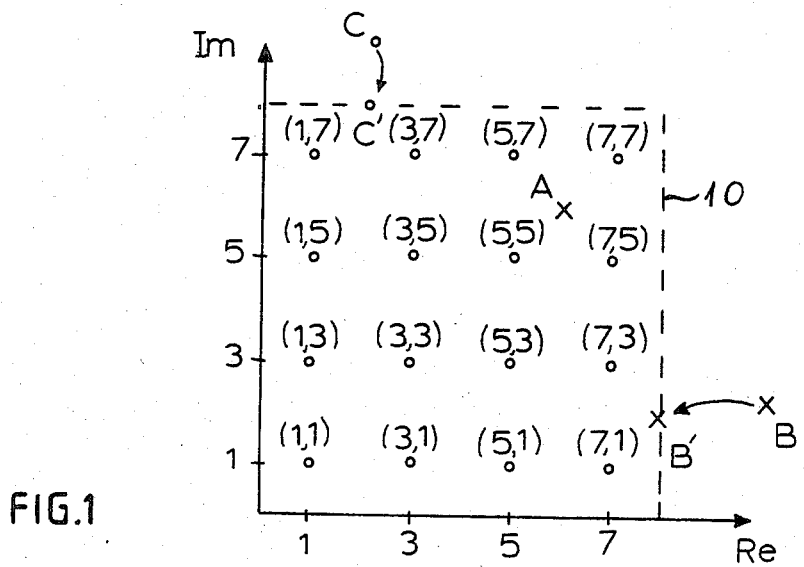
FIG. 1 shows the first quadrant of a 64-point signal constellation.

Reference is now made to the drawings and especially to FIG. 1 showing the first quadrant of a typical 64-point signal constellation used in 14.4 k bit QAM (quadrature amplitude modulation) data communication scheme. The ideal (i.e. error free) points of the constellation are indicated by dots. Hereinafter each such point shall be identified by its in-phase and quadrature components defined in FIG. 1.

At the receiver, a perimeter 10 is defined around the signal constellation as shown in FIG. 1 to delineate the maximum permissible amplitudes for the components of the received signals. Normally all received points are expected to be within perimeter 10. One such point is designated as point A in the Figure. However, if a signal (B) is received outside the perimeter, this signal is projected linearly back to a point B' on the perimeter as shown. Details of this operation are described in more complete fashion below.

Figure 2:
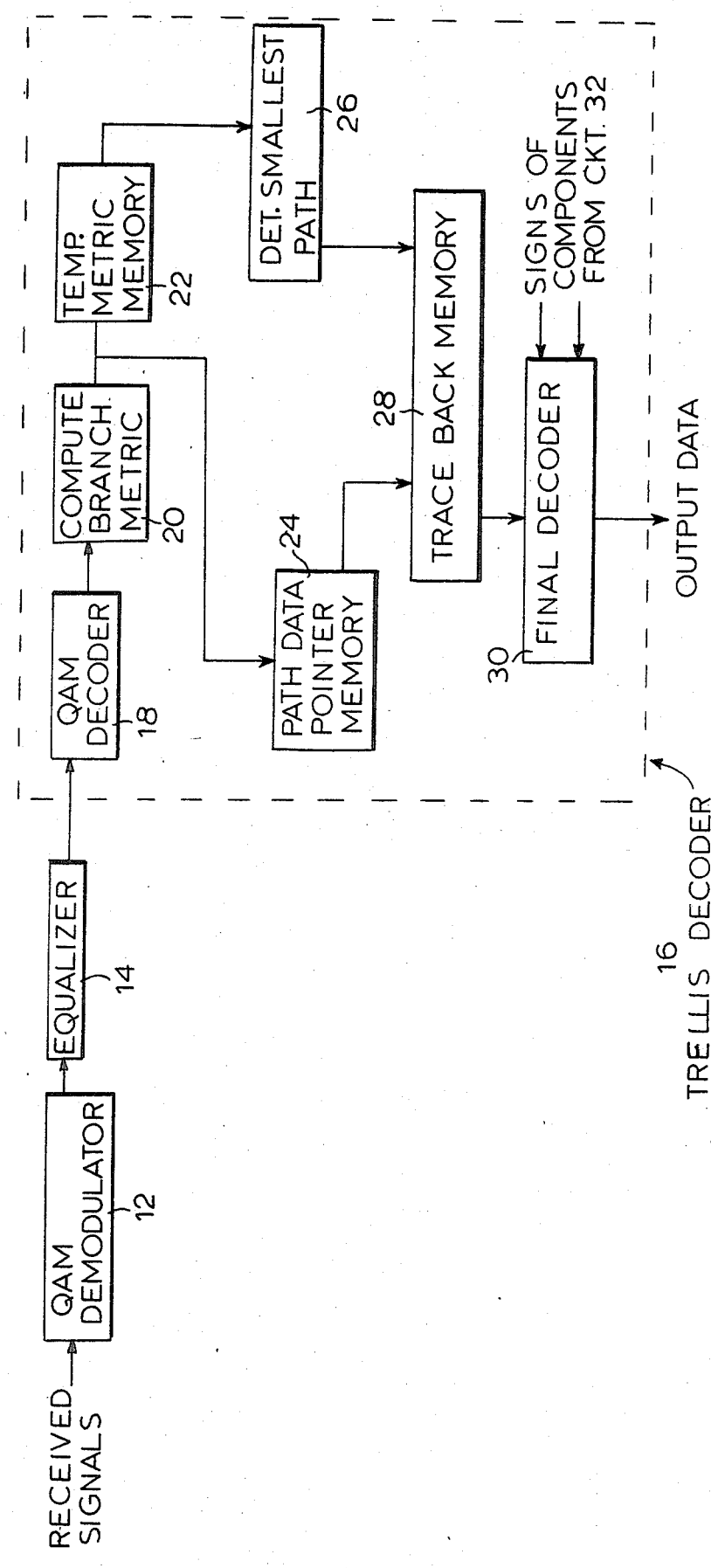
FIG. 2 shows the elements of a Viterbi decoder.

The receiver section of a digital modem is shown in FIG. 2. It comprises a QAM demodulator 12 which converts signal received from a communication channel into corresponding in-phase and quadrature components. The outputs of demodulator 12 are fed to an equalizer 14 which dynamically equalizes these outputs. The equalized outputs are fed to a trellis decoder 16. The trellis decoder comprises a QAM decoder 18 for converting the equalized signals to coordinates corresponding to points on a complex plane. These coordinates are fed to a block 20 which computes a branch metric corresponding to each received signal in accordance with a preselected algorithm. The operation of block 20 is described more fully below. The branch metric is sent to a temporary metric memory, and a path data point memory 22.

The temporary memory is used to store the branch metrics for all the points of the signal constellation. A smallest path determination circuit 26 is used to calculate the smallest metric in accordance with certain constants stored in temporary memory 22. The smallest path is used by a trace back memory 28 to track back the last 4–16 bauds to generate a final received point. This final point is fed to a final decoder 30 for decoding.

Figure 3:
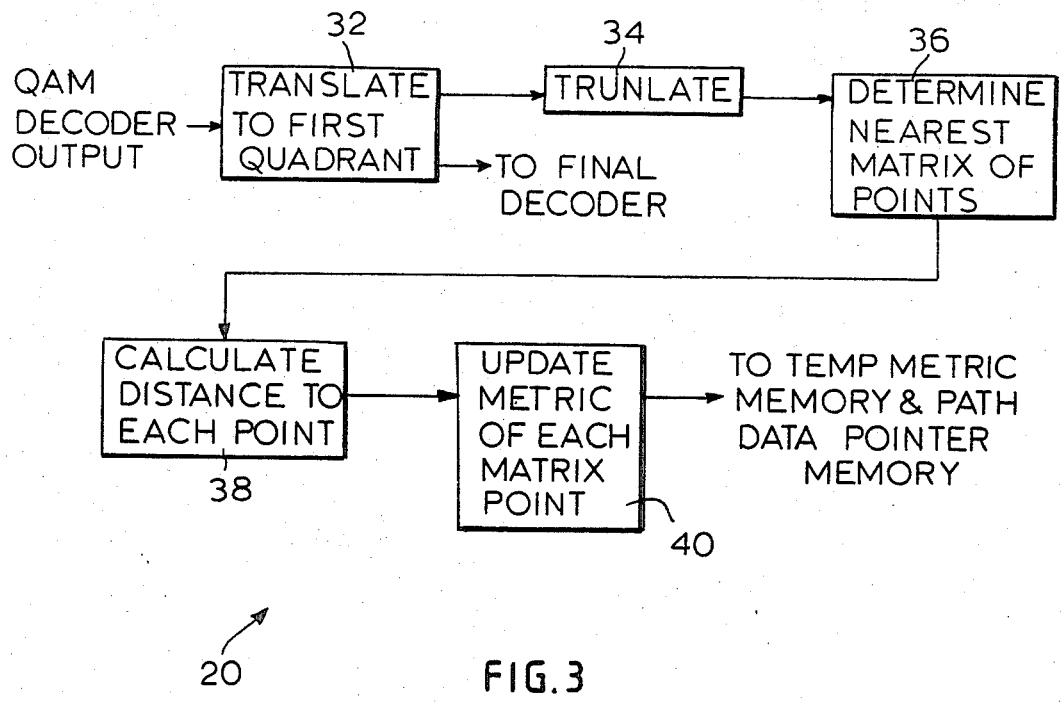
FIG. 3 shows how the branch metric in a Viterbi decoder is computed according to the present invention.

The branch metric computation is accomplished by block 20 as follows (see FIG. 3). The QAM decoder output is first translated by circuit 32 to the first quadrant by adding a constant offset to the real and imaginary components of the received signals. Henceforth, all signal processing takes place in the first quadrant, thereby reducing the complexity of the required computations. From circuit 32, the signals are fed to a truncating circuit 34. This circuit is provided to insure that the received point is within the bounds of perimeter 10 (see FIG. 1). Thus, if the received point corresponds to point A, then its components are merely passed on by circuit 34. However, if the received point corresponds to point B then its real component is truncated to the corresponding value of perimeter 10 thereby shifting the respective point to B'. Similarly, if the received point corresponds to point C, its imaginary component is truncated thereby shifting the received point to C'. This maneuver is useful because it constricts the signals manipulated hereinafter to a preselected range. Furthermore, without it, a single point B or C outside perimeter 10 would unduly increase the size of the corresponding branch metrics.

From circuit 34, the signals are fed to circuit 36 which determine a set of points disposed around point A. For example, for received points disposed centrally within the perimeter 10, a 3×3 matrix set may be selected. In the case of point A the following set of points may be selected: (7, 3); (5, 3); (3, 3); (3, 5); (3, 7); (5, 7); (7, 7); (7, 5); (5, 5). It is very likely that point A corresponds to one of these points. Next, circuit 38 calculates the Euclidean distance to each point and circuit 40 uses these calculations to update the branch metrics for each point stored in memory 24. This calculation may be done simultaneously for all the points of the set, or serially n a preselected order such as the one recited above.

In order to calculate the Euclidean distance between a received point and the nine points of the selected matrix, the vertical and horizontal offsets relative to each matrix point must be determined. For example, if point A in FIG. 1 is at (5.8, 5.8) then the horizontal offset to point (5, 7) is 0.8 and the vertical offset is 1.2. It is immediately obvious that in fact only six offsets (3 horizontal and 3 vertical) are needed to calculate the Euclidean distances between A and all the points of the matrix. Using only six offsets provides a tremendous saving in time, the required memory and the number of calculations because for each received point only the metrics of the preselected set are updated and not the whole signal constellation.

For received points disposed near an axis or the perimeter (such as points B' and C') the metrics for the six nearest points are calculated.

What is claimed is:

1. A trellis decoder for a receiver section of a QAM modem for decoding QAM received signals, said signals being represented by a series of points on a complex plane, comprising:

a QAM demodulator;

a QAM decoder for converting signals which have been received from a channel, demodulated and equalized to a form in which they represent said series of points on said complex plane;

means connected to an output of said QAM decoder for computing branch metrics having means for determining coordinates of a set of ideal points of a signal constellation corresponding to a received signal and having means for translating said coordinates to a first quadrant of said complex plane;

temporary memory means for storing the branch metrics of each ideal point;

path calculating means for determining the coordinates to be assigned to a received signal, said path calculating means comprising a smallest path determination circuit connected to an output of said temporary memory and functioning to calculate the smallest metric distance between a point calculated for said received signal and a closest said ideal point, a trace back memory connected to an output of said smallest path determination circuit and functioning to trace back a number of previously received bauds to generate a final received point;

a path data pointer memory connected to an output of said means for computing branch metrics and having an output to said trace back memory; and final decoding means connected to an output of said for decoding the coordinator of a received point, said coordinates having been determined by said path calculating means.

2. The decoder of claim 1 further comprising functioning means for shifting said received point to an area bordered by a preselected perimeter.

3. The trellis decoder of claim 1 wherein said means for translating comprises a circuit for adding a constant offset to real and imaginary components of said received signals.

* * * * *